United States Patent
Hatakeyama et al.

(10) Patent No.: US 8,796,694 B2
(45) Date of Patent: Aug. 5, 2014

(54) SEMICONDUCTOR DEVICE

(75) Inventors: Tetsuo Hatakeyama, Yokohama (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 361 days.

(21) Appl. No.: 12/407,048

(22) Filed: Mar. 19, 2009

(65) Prior Publication Data
US 2010/0078650 A1 Apr. 1, 2010

(30) Foreign Application Priority Data
Sep. 26, 2008 (JP) ................. 2008-249163

(51) Int. Cl.
*H01L 29/15* (2006.01)

(52) U.S. Cl.
USPC ....... 257/77; 257/199; 257/322; 257/E31.054

(58) Field of Classification Search
USPC .......... 257/77, 199, 322, 372, 383, 386, 394, 257/438, 481, 492, 493, 496, 503, 5, 47, 257/551, 689, E21.054, E21.055, E21.065, 257/E27.063, E21.063, E31.116, E29.18, 257/E29.307, E29.335, E29.355, E29.357
See application file for complete search history.

(56) References Cited

U.S. PATENT DOCUMENTS

| | | | |
|---|---|---|---|
| 6,806,147 B1 * | 10/2004 | Yu et al. ................. | 438/289 |
| 2002/0034852 A1 * | 3/2002 | Alok ...................... | 438/275 |
| 2002/0038891 A1 * | 4/2002 | Ryu et al. ................ | 257/350 |
| 2005/0001290 A1 * | 1/2005 | Chan et al. .............. | 257/627 |
| 2005/0184317 A1 * | 8/2005 | Hatakeyama et al. ...... | 257/262 |
| 2006/0065899 A1 * | 3/2006 | Hatakeyama et al. ..... | 257/77 |
| 2006/0237728 A1 * | 10/2006 | Ryu ......................... | 257/77 |
| 2006/0289874 A1 * | 12/2006 | Das et al. ................. | 257/77 |

FOREIGN PATENT DOCUMENTS

| | | |
|---|---|---|
| JP | 5-190561 | 7/1993 |
| JP | 10-308510 | 11/1998 |
| JP | 2005-183943 | 7/2005 |
| JP | 2005-310886 | 11/2005 |
| JP | 2006-100593 | 4/2006 |
| JP | 2008-503894 | 2/2008 |

OTHER PUBLICATIONS

Arai et al., "Basics and Application of SiC Elements," Ohmsha Ltd., Mar. 2003, pp. 165-185.
Notification of Reasons for Rejection issued by the Japanese Patent Office on Mar. 19, 2013, for Japanese Patent Application No. 2008-249163, and English-language translation thereof.
First Office Action issued by Japanese Patent Office in corresponding U.S. Appl. No. 2008-249163 dated Jan. 7, 2014, 6 pages.

* cited by examiner

*Primary Examiner* — Cuong Q Nguyen
*Assistant Examiner* — Yosef Gebreyesus
(74) *Attorney, Agent, or Firm* — Finnegan, Henderson, Farabow, Garrett & Dunner, LLP

(57) ABSTRACT

A semiconductor device includes a semiconductor substrate made of silicon carbide and having a surface, a normal vector for the surface having an off angle with respect to a <0001> direction or a <000-1> direction, a semiconductor layer of a first conductivity type formed on the semiconductor substrate, a first semiconductor region of a second conductivity type formed in a surface region of the semiconductor layer, a source region of a first conductivity type formed in a surface region of the first semiconductor region, a second semiconductor region of a second conductivity type formed in the surface region of the semiconductor layer, contacting the first semiconductor region, and having a bottom surface lower than a bottom surface of the first semiconductor region, wherein at least one end of the bottom surface of the second semiconductor region is perpendicular to an off angle direction.

13 Claims, 2 Drawing Sheets

SEMICONDUCTOR DEVICE

CROSS-REFERENCE TO RELATED APPLICATIONS

This application is based upon and claims the benefit of priority from prior Japanese Patent Application No. 2008-249163, filed Sep. 26, 2008, the entire contents of which are incorporated herein by reference.

BACKGROUND OF THE INVENTION

1. Field of the Invention

The present invention relates to a semiconductor device.

2. Description of the Related Art

Recently, power devices made of silicon carbide (SiC) have been developed. SiC is a wide-bandgap semiconductor, and has a breakdown field strength approximately 10 times as great as that of silicon (Basics and Application of SiC Elements, Kazuo Arai and Sadafumi Yoshida, pp. 165-185, Published by Ohmsha Ltd., Issued March 2003). In the field of semiconductor devices formed of SiC, a SiCMOSFET on the surface of which a MOS structure is formed has been developed, as in the case of silicon.

In a SiCMOSFET, however, resistivity of a p-body region is high. Further, the electric field tends to concentrate on an end portion of the p-body region. Therefore, there has been the problem that Voltage drop occurs in the p-body region during an avalanche breakdown and a parasitic bipolar transistor formed of a source region, a p-body region, and an n-base region operates. Moreover, since the temperature characteristics of this bipolar transistor are positive, a positive feedback occurs, and currents are concentrated on specific cells. This results in the problem that the temperature is locally elevated and specific cells are easily destroyed.

BRIEF SUMMARY OF THE INVENTION

According to an aspect of the present invention, there is provided a semiconductor device comprising: a semiconductor substrate made of silicon carbide and having a surface, a normal vector for the surface having an off angle with respect to a <0001> direction or a <000-1> direction; a semiconductor layer of a first conductivity type formed on the semiconductor substrate, a first semiconductor region of a second conductivity type formed in a surface region of the semiconductor layer; a source region of a first conductivity type formed in a surface region of the first semiconductor region; a second semiconductor region of a second conductivity type formed in the surface region of the semiconductor layer, contacting the first semiconductor region, and having a bottom surface lower than a bottom surface of the first semiconductor region; a gate insulation film formed the semiconductor layer, the first semiconductor region, and the source region; a gate electrode formed on the gate insulation film; a source electrode formed on the source region and the second semiconductor region; and a drain electrode formed on a back surface of the semiconductor substrate, wherein at least one end of the bottom surface of the second semiconductor region is perpendicular to an off angle direction of the normal vector with respect to the <0001> direction or the <000-1> direction.

DETAILED DESCRIPTION OF THE INVENTION

Hereinafter, details of an embodiment of the present invention will be described with reference to the accompanying drawings.

The basic configuration of the present embodiment will be described with reference to FIGS. 1-4.

Figure 1:
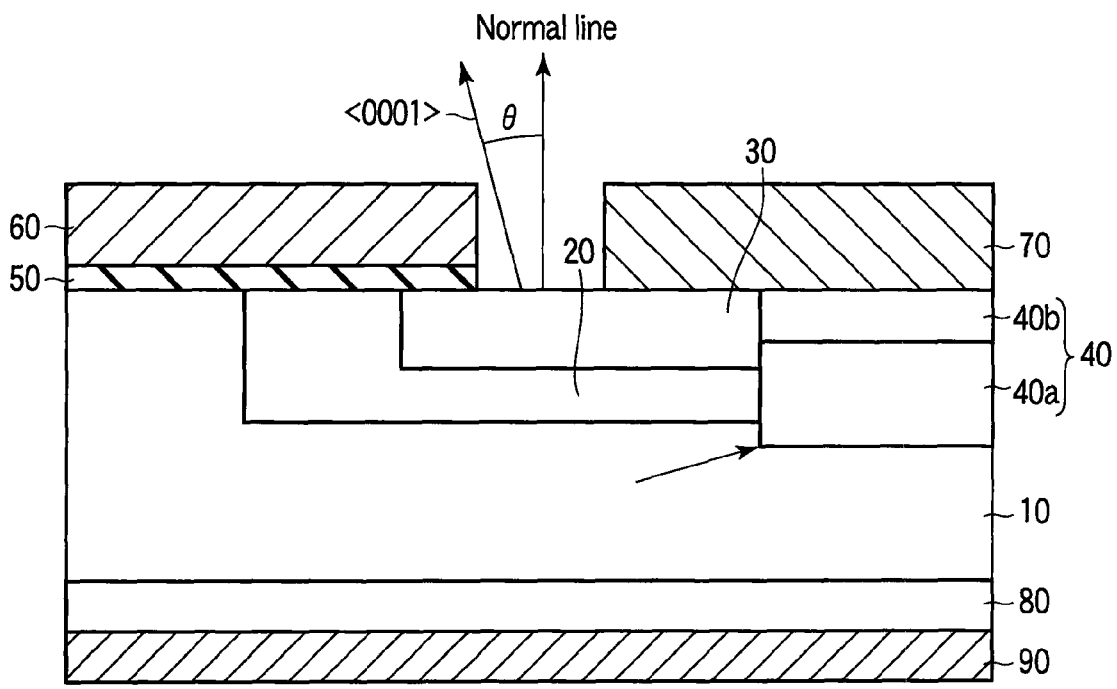
FIG. 1 is a cross-sectional view schematically showing a configuration of a semiconductor device according to an embodiment of the present invention.

FIG. 1 is a cross-sectional view schematically showing a basic configuration of a semiconductor device according to the present embodiment.

As shown in FIG. 1, a semiconductor substrate 80 is formed of SiC crystals which are hexagons, and a normal line on a surface of the semiconductor substrate 80 is displaced $\Theta$ degrees (4-8 degrees, for example) from the direction <0001> (c-axis) of the SiC crystals. The angle of displacement ($\Theta$ degrees) will be referred to as an off angle. Further, the direction of a vector obtained by subtracting a unit vector in c-axis direction from a unit vector in the normal direction will be referred to as a direction of an off angle (off-angle direction).

An $n^-$-type semiconductor layer (semiconductor layer of first conductivity type) 10 is provided on the semiconductor substrate 80. In a surface region of the semiconductor layer 10, a p-type p-body region (first semiconductor region of a second conductivity type) 20 is formed. In a surface region of the p-body region 20, an n-type source region 30 is formed. The lower part of the p-body region 20 has a higher impurity concentration than the upper part, and has a "retrograde" structure.

A p-type semiconductor region (second semiconductor region) 40 is formed inside a surface region of a semiconductor layer 10. The semiconductor region 40 contacts the p-body region 20 and the source region 30. Further, the bottom surface of the semiconductor region 40 is lower than the bottom surface of the p-body region 20. Accordingly, the bottom surface of the semiconductor region 40 protrudes into the semiconductor layer 10. Further, the semiconductor region 40 is formed of a $p^+$-type semiconductor region (lower part of the second semiconductor region) 40a having an impurity concentration of approximately $5\times10^{18}$ to $1\times10^{19}$ $cm^{-3}$, and a $p^{++}$-type p-body contact region (upper part of the second semiconductor region) 40b having an impurity concentration greater than or equal to $1\times10^{19}$ $cm^{-3}$. The impurity concentration of the semiconductor region 40a is higher than the impurity concentration of the p-body region 20. The semiconductor region 40a protrudes into the semiconductor layer 10 and has an impurity concentration higher than the p-body region 20, and therefore the electric field concentrates on one side of the bottom surface of the semiconductor region 40a, as shown by the arrow.

A gate oxide film (gate insulation film) 50 is formed on the semiconductor layer 10, the p-body region 20, and the source region 30. A gate electrode 60 is formed on the gate oxide film 50. A source electrode 70 is formed on the source region 30 and the semiconductor region 40. Further, a drain electrode 90 is formed on a back surface of the semiconductor substrate 80.

Figure 2:
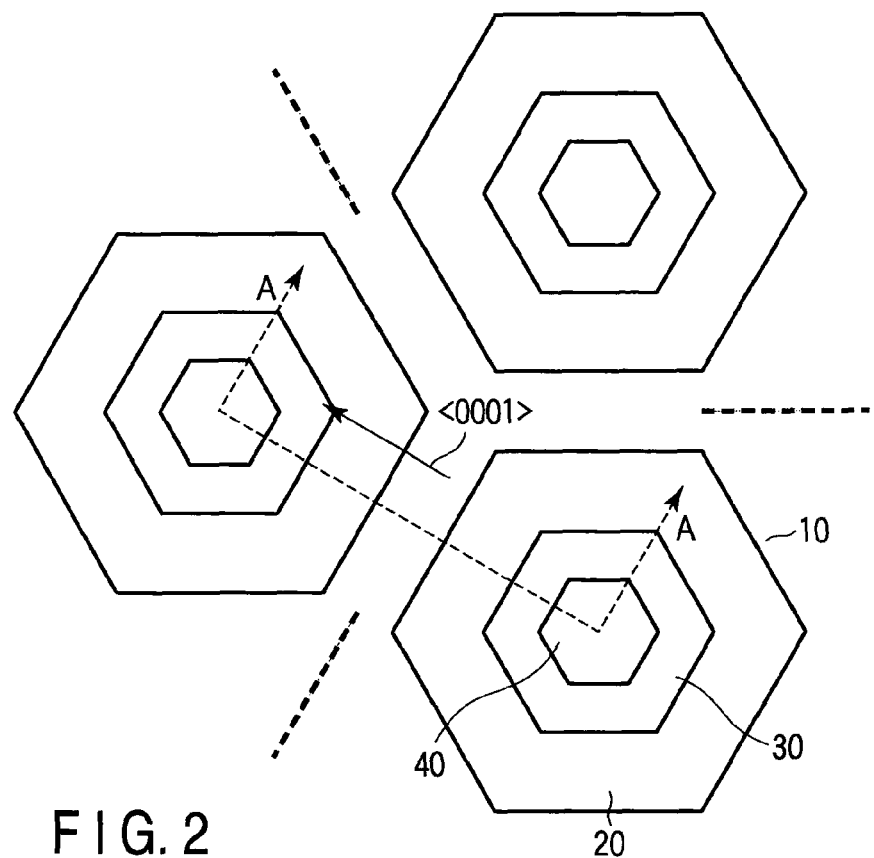
FIG. 2 is a plan view schematically showing a configuration of a semiconductor device according to an embodiment of the present invention.
Figure 3:
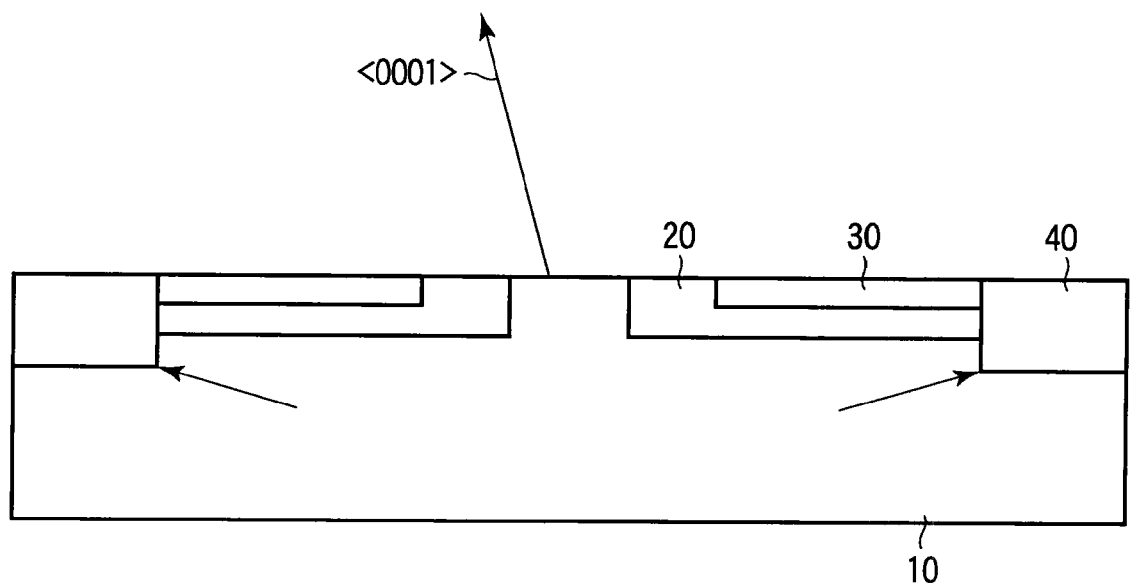
FIG. 3 is a cross-sectional view schematically showing a configuration of a semiconductor device according to an embodiment of the present invention.
Figure 4:
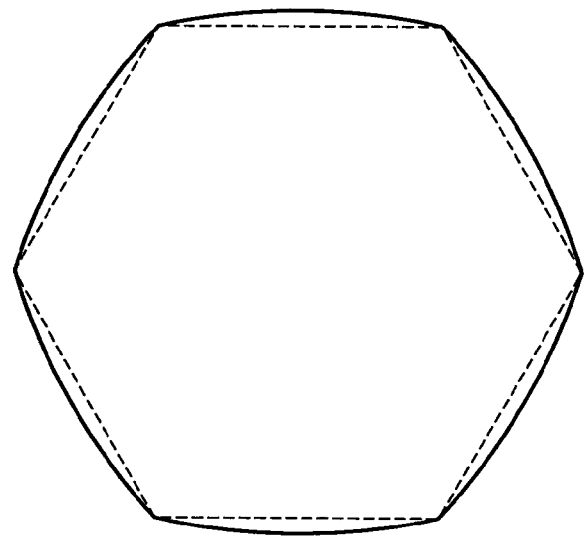
FIG. 4 is a plan view schematically showing a configuration of a semiconductor device according to an embodiment of the present invention.

FIG. 2 is a plan view schematically showing the basic configuration of a semiconductor device according to the present embodiment. FIG. 3 is a cross-sectional view cut across line A-A in FIG. 2. For simplicity, the gate oxide film 50, the gate electrode 60, the source electrode 70, and the like are omitted.

As shown in FIG. 2, the bottom surface (pattern) of the semiconductor region 40 has an orthohexagonal shape having linear sides. The bottom surface of each of the source region 30 and the p-body region 20 has an orthohexagonal shape similar to that of the bottom surface of the semiconductor region 40. The bottom surface of the semiconductor region 40 may have a shape obtained by bending each of the sides of the hexagon in an arc. Similarly, the bottom surface of each of the source region 30 and the p-body region 20 may have a shape obtained by bending each of the sides of the hexagon in an arc. Each of the semiconductor regions 40 is arranged such that at least one side of the hexagon and the off-angle direction are made perpendicular to each other. That is, the bottom surface of the semiconductor region 40 has at least one side (end part or edge) perpendicular to the off-angle direction.

In actual, a plurality of elements having the structures shown in FIGS. 1-3 are arranged. Further, a publicly-known edge-termination structure is provided in a terminal part.

According to the above-described embodiment, the bottom surface of the p-type semiconductor region 40a protrudes into the n-type semiconductor layer 10. As a result, the electric field concentrates on the end part of the bottom surface of the semiconductor region 40a, and avalanche breakdown can be selectively caused. Thereby, a parasitic bipolar transistor formed of a semiconductor layer 10, a p-body region 20, and a source region 30 can be prevented from being formed, and the electric field can be prevented from concentrating on a specific p-body region 20.

Further, since the semiconductor substrate 80 is formed of SiC crystals which are hexagons, anisotropy is observed in the direction in which avalanche breakdown easily occurs and avalanche breakdown easily occurs in the electric field in the direction perpendicular to the c-axis. In the above-described embodiment, the normal line of the surface of the semiconductor substrate 80 is displaced Θ degrees from the c-axis, avalanche breakdown can be easily caused in the end part of the bottom surface of the semiconductor region 40a by the electric field in the directions shown by the arrows in FIG. 3.

In the above-described embodiments, hexagonal pattern shapes are described. Each of the semiconductor region 40 is arranged such that the specific side of the bottom surface of the semiconductor region 40 and the c-axis are perpendicular to each other. Therefore, in each of the semiconductor regions 40, the electric field can be concentrated on sides, instead of angles (points). By concentrating the electric field on sides of the bottom surface of each of the semiconductor regions 40, local concentration of the electric field can be prevented, and thereby stable avalanche breakdown can be caused.

As described above, according to the present embodiment, stable avalanche breakdown can be generated on a specific side of a bottom surface of each of the hexagonal semiconductor regions 40, and thereby a semiconductor device excellent in fracture resistance can be fabricated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
  a semiconductor substrate made of silicon carbide and having a surface, a normal vector for the surface having an off angle with respect to a <0001>direction or a <000-1>direction;
  a semiconductor layer of a first conductivity type formed on the semiconductor substrate,
  a first semiconductor region of a second conductivity type formed in a surface region of the semiconductor layer;
  a source region of a first conductivity type formed in a surface region of the first semiconductor region;
  a second semiconductor region of a second conductivity type formed in the surface region of the semiconductor layer, the second semiconductor region having a lower part and an upper part;
  a gate insulation film formed on the semiconductor layer, the first semiconductor region, and the source region;
  a gate electrode formed on the gate insulation film;
  a source electrode formed on the source region and the second semiconductor region; and
  a drain electrode formed on a back surface of the semiconductor substrate,
  wherein at least one end of the bottom surface of the second semiconductor region is perpendicular to an off angle direction of the normal vector with respect to the <0001>direction or the <000-1>direction,
  the lower part of the second semiconductor region contacts a side surface of the source region and a side surface of the first semiconductor region, and has a bottom surface located in a lower position relative to a bottom surface of the first semiconductor region, and
  the upper part of the second semiconductor region contacts a side surface of the source region, and has a bottom surface located in a higher position relative to a bottom surface of the source region.

2. The device according to claim 1, wherein the bottom surface of the second semiconductor region has a hexagonal shape having linear sides.

3. The device according to claim 1, wherein the bottom surface of the second semiconductor region has a shape obtained by bending each side of a hexagon into an arc.

4. The device according to claim 1, wherein the second semiconductor region has a higher impurity concentration than the first semiconductor region.

5. The device according to claim 1, wherein a lower part of the first semiconductor region has a higher impurity concentration than an upper part of the first semiconductor region.

6. The device according to claim 1, wherein an upper part of the second semiconductor region has a higher impurity concentration than a lower part of the second semiconductor region.

7. The device according to claim 6, wherein the impurity concentration of the lower part of the second semiconductor region ranges from $5\times10^{18}$ cm$^{-3}$ to $1\times10^{19}$ cm$^{-3}$.

8. The device according to claim 6, wherein the impurity concentration of the upper part of the second semiconductor region is greater than or equal to $1\times10^{19}$ cm$^{-3}$.

9. The device according to claim 1, wherein the off angle is less than or equal to 8 degrees.

10. The device according to claim 1, wherein the off angle is greater than or equal to 4 degrees.

11. The device according to claim 1, wherein the bottom surface of the source region has a hexagonal shape.

12. The device according to claim 1, wherein the bottom surface of the first semiconductor region has a hexagonal shape.

13. The device according to claim 1, wherein the first conductivity type is n-type and the second conductivity type is p-type.

* * * * *